(12) United States Patent
Huang et al.

(10) Patent No.: US 6,762,069 B2
(45) Date of Patent: Jul. 13, 2004

(54) METHOD FOR MANUFACTURING LIGHT-EMITTING ELEMENT ON NON-TRANSPARENT SUBSTRATE

(75) Inventors: Chung-Kuei Huang, Hsinchu (TW); Chih-Sung Chang, Hsinchu (TW); Tzer-Perng Chen, Hsinchu (TW); Kuang-Neng Yang, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 16 days.

(21) Appl. No.: 10/298,567

(22) Filed: Nov. 19, 2002

(65) Prior Publication Data

US 2004/0096998 A1 May 20, 2004

(51) Int. Cl.⁷ .............................................. H01L 21/00
(52) U.S. Cl. ..................... 438/22; 438/46; 438/455; 438/604
(58) Field of Search .......................... 438/22–24, 34–47, 438/455, 602–609

(56) References Cited

U.S. PATENT DOCUMENTS

2003/0211645 A1 * 11/2003 Lee et al. ..................... 438/46

* cited by examiner

*Primary Examiner*—H. Jey Tsai
(74) *Attorney, Agent, or Firm*—Browdy and Neimark, P.L.L.C.

(57) ABSTRACT

A method for manufacturing light-emitting device on non-transparent substrate includes the steps of forming a semiconductor epitaxial layer, a first conductive layer, a reflecting layer and a first conduction layer on a first substrate, and forming second conduction layer on a second substrate. Afterward, the first conduction layer and the second conduction layer is bounded by thermal pressing. The first substrate is then removed and a second conductive layer is formed to complete a light-emitting device. The light-emitting device can be incorporated with wetting layer and blocking layer to prevent inner diffusion and enhance external quantum efficiency.

36 Claims, 5 Drawing Sheets

METHOD FOR MANUFACTURING LIGHT-EMITTING ELEMENT ON NON-TRANSPARENT SUBSTRATE

FIELD OF THE INVENTION

The present invention relates to a method for manufacturing light-emitting device on non-transparent substrate, especially to a method for manufacturing light-emitting device on non-transparent substrate with high efficiency, better forward illumination and enhanced heat dissipation effect.

BACKGROUND OF THE INVENTION

The nitride compound such as gallium nitride (GaN) is a direct band-gap material with energy gap corresponding to photon energy of green light and blue light. Therefore, the nitride compound is under extensive research to provide blue light source and green light source with higher efficiency and more practical application.

As to the material of substrate, sapphire has the advantage of good stability in high temperature condition during epitaxial growth process. However, the GaN film has relatively high lattice mismatch (16%) with underlying-sapphire substrate. To alleviate the effect of lattice mismatch, a GaN buffer layer is firstly grown on the sapphire substrate with a relatively low temperature (450–800° C.). The GaN buffer layer is quasi epitaxial layer and has profound effect on growth of successive epitaxial layer and device performance. Afterward, an n-type GaN layer with thickness 3–4 mm is grown at 1000° C. and an InGaN multiple quantum well active layer is grown at 600–900° C., wherein the number of quantum wells is 4 to 10. After, a p-type GaN layer with thickness is grown again at 1000° C. Finally, aside and n-side contacts are manufactured to complete the light-emitting device.

However, in above-mentioned light-emitting device, the p-side and n-side contacts are manufactured at the same face opposite to the sapphire substrate due to the electrical insulation of the sapphire substrate. The effective light emitting area is limited. Moreover, the sapphire has high hardness rendering the difficulty for slicing.

Alternative, a silicon substrate has the advantages of fewer defect, higher electrical conductivity, and lower price for larger area. However, the silicon substrate is a light absorbing material to reduce external quantum efficiency.

SUMMARY OF THE INVENTION

It is an object of the present invention to a method for manufacturing light-emitting device with higher efficiency.

It is another object of the present invention to a method for manufacturing light-emitting device with higher heat dissipation effect.

It is still another object of the present invention to a method for manufacturing light-emitting device with better forward illumination.

The various objects and advantages of the present invention will be more readily understood from the following detailed description when read in conjunction with the appended drawing, in which:

DETAILED DESCRIPTION OF THE INVENTION

Figure 1:
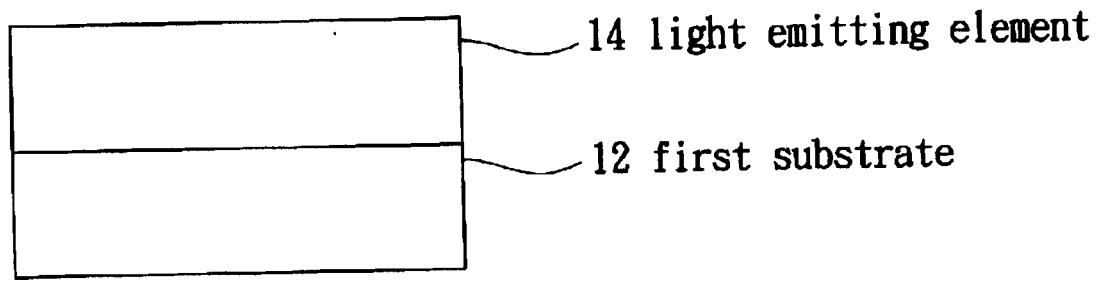
FIG. 1 shows a sectional view of prior art DC light-emitting device.
Figure 2:
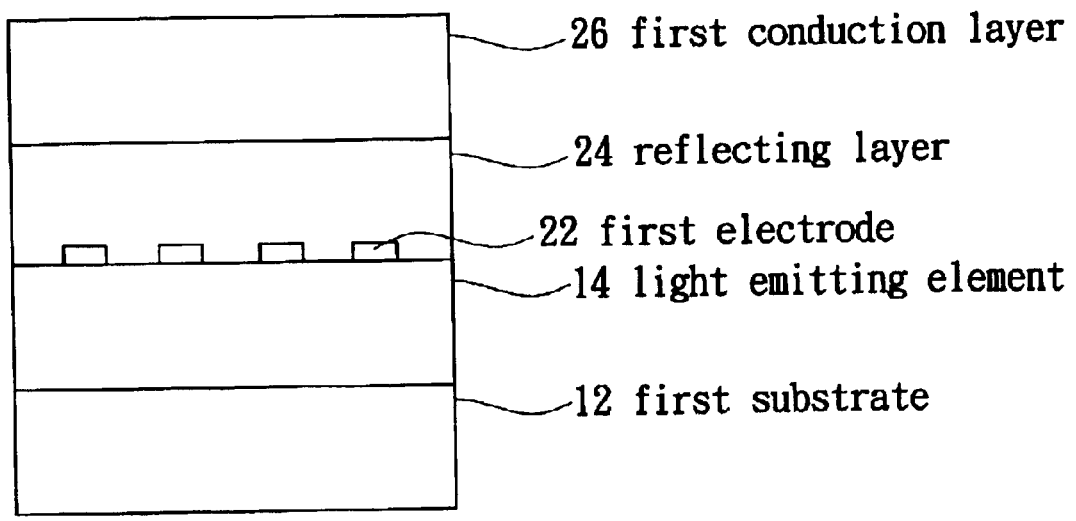
FIG. 2 shows a sectional view of a first substrate and related components in the present invention.

FIG. 1 shows a sectional view of a first substrate 12 and related components thereon according to the present invention. The first substrate 12 can be one of Si, Ge, GaAs or GaP substrate. A GaN based light emitting element 14 is epitaxially formed on the first substrate 12 and then annealed in nitrogen atmosphere to activate a P-type GaN layer in the light emitting element 14. A first electrode 22 is formed by plating Ni/Au alloy on the light emitting element 14. An annealing process is then performed to ensure good electrical conductivity between the light emitting element 14 and the first electrode 22. A reflecting layer 24 is formed atop the resulting structure by plating metal layer with high reflectivity such as Au, Ag and Pt. A first conduction layer 26 is formed atop the resulting structure and made of low melting point material such as In or AuSn with melting point between 160° C. and 400° C. The first electrode 22 has an area smaller than that of the light emitting element 14 and has point-like or meshed pattern. The first electrode 22 utilizes conductive material such as Ni/Au, Pt/Au or Pd/Au. The light emitting element 14 is composed of an epitaxial layer of first conductive type (such as N type), a active epitaxial layer, and an epitaxial layer of second conductive type (such as P type) successively formed on the first substrate 12. However, the formation of the light emitting element 14 is well know art and not described in detail here.

Figure 3:
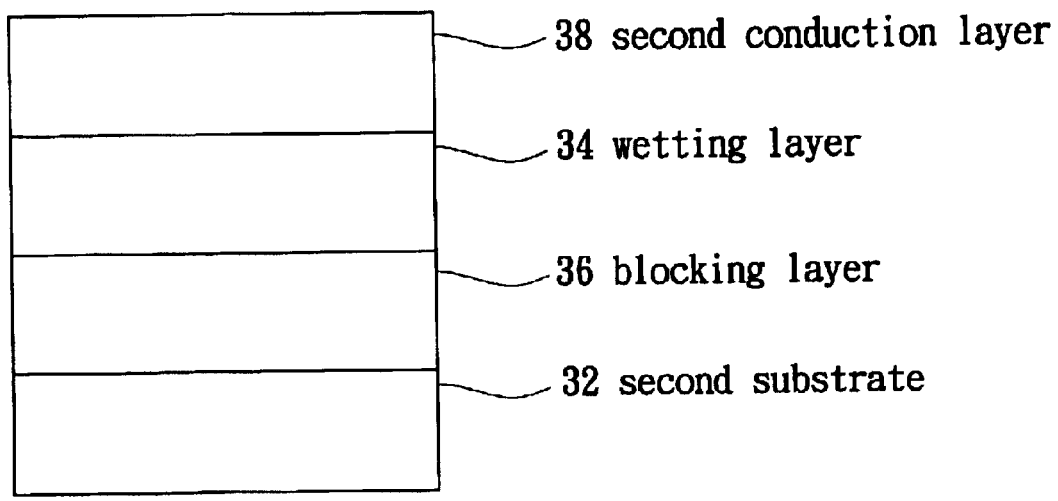
FIG. 3 shows a sectional view of a second substrate and related components in the present invention.

With reference now to FIG. 3, a second substrate 32 of high electrical conductivity and thermal conductivity such as Si, graphite, Al or Cu is prepared. A wetting layer 34 is formed on the second substrate 32 to provide good adhesion of metal on the second substrate 32. A blocking layer 36 and a second conduction layer 38 are successively formed on the resulting structure, wherein the blocking layer 36 prevents an inner diffusion of the second conduction layer 38. The wetting layer 34 can be selected from the group consisting of Ti and Cr. The blocking layer 36 can be selected from the group consisting of Pt and Mo. The conduction layer 38 can be selected from the group consisting of Au and Al.

Figure 4:
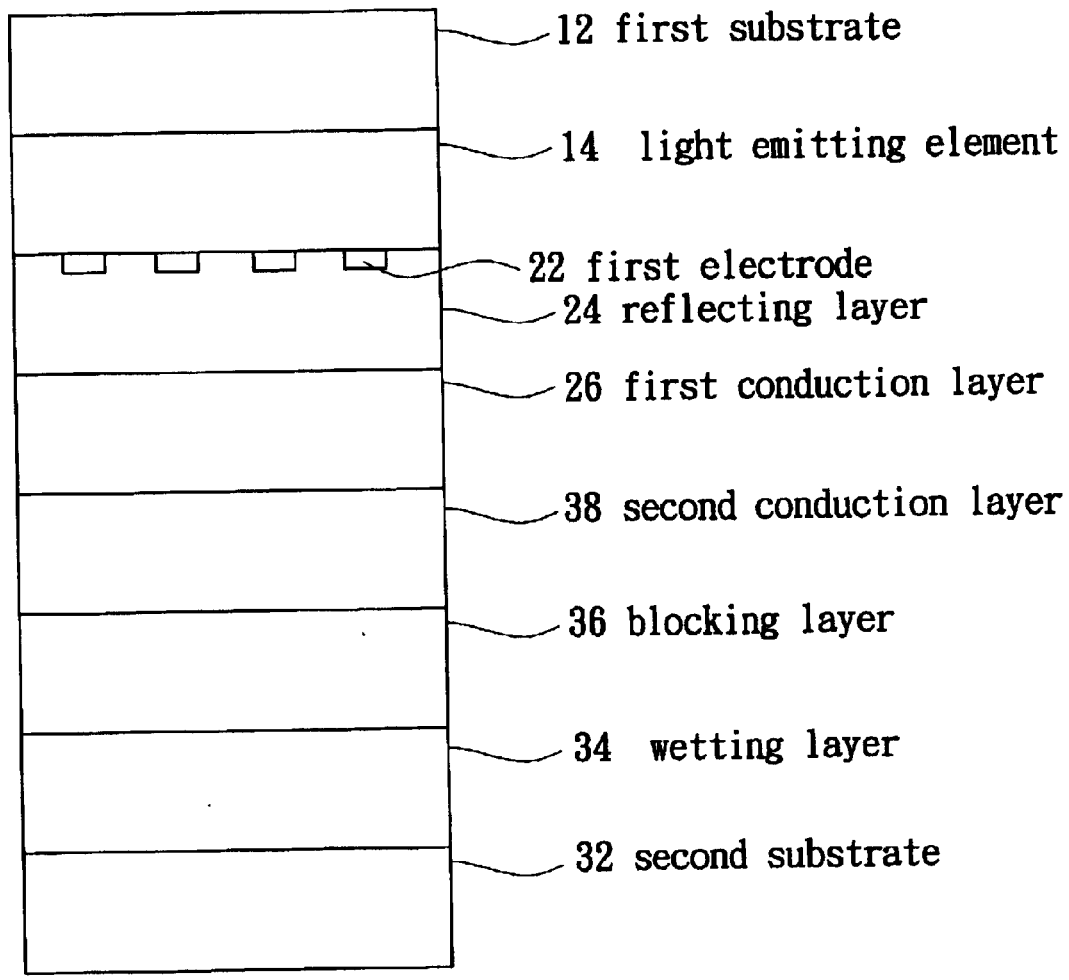
FIG. 4 shows a sectional view of combining the two substrates.
Figure 5:
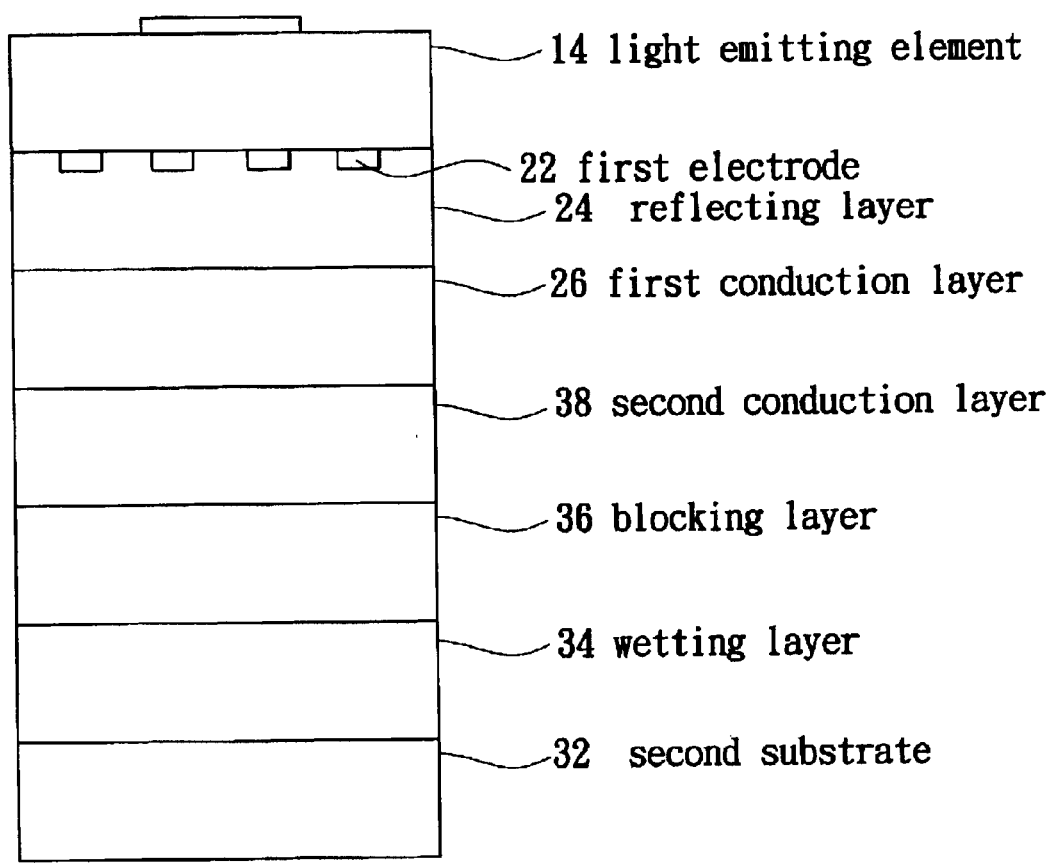
FIG. 5 shows a sectional view of the resulting device.

With reference to FIG. 4, the first substrate 12 and the second substrate 32 and the associated components are combined by bonding the first conduction layer 26 and the second conduction layer 38. More particularly, the first conduction layer 26 and the second conduction layer 38 are thermally pressed at a temperature below 400° C. (preferably 180–400° C. ). Afterward, the first substrate 12 is removed by wet- or dry-chemical etching to expose the epitaxial structure of the light emitting element 14. Afterward, a second electrode 28 is formed on the light emitting element 14 and can be selected from the group consisting of TiAl and AUGe/Ge/Au, thus completing a vertical-type light emitting diode with uniform current flowing through the pn junction thereof. The backward light from the light emitting element 14 is reflected by the reflecting layer 24 to enhance forward efficiency.

To sum up, the light-emitting device according to the present invention has following advantages:

1. The silicone substrate has better thermal conductivity than sapphire substrate to prevent the degrade of internal quantum efficiency due to thermal effect at high power operation.
2. The silicone substrate has smaller hardness than sapphire substrate to save the effort in slicing, especially the requirement of diamond slicing tool.
3. The silicone substrate has better electrical conductivity than sapphire substrate. The electrodes can be provided on opposite faces of the device to increase device density.
4. The silicone substrate is cheaper than sapphire substrate. The cost can be reduce to ¼.
5. The provision of the reflecting layer can prevent the absorption by silicone substrate to further enhance external quantum efficiency.

Although the present invention has been described with reference to the preferred embodiment thereof, it will be understood that the invention is not limited to the details thereof. Various substitutions and modifications have suggested in the foregoing description, and other will occur to those of ordinary skill in the art. For example, the semiconductor epitaxial layer may be selected from a group consisting of AlGaAs and AlGaInP, the second conductive layer may be selected from a group consisting of AuGe/Ni/Au and AuGe/Au, the first conductive layer may be selected from a group consisting of Ti/Pt//Au, AuBe/Au amd AuZn/Au. Therefore, all such substitutions and modifications are intended to be embraced within the scope of the invention as defined in the appended claims.

We claim:

1. A method for manufacturing light-emitting device on non-transparent substrate, comprising following steps:
   a. preparing a first substrate;
   b. forming a semiconductor epitaxial layer on the first substrate and functioned as a light emitting layer;
   c. forming a first conductive layer on part of an exposed face of the semiconductor epitaxial layer;
   d. forming a reflecting layer over the exposed face of the semiconductor epitaxial layer and covering the first conductive layer, the reflecting layer reflecting a light emitted from the semiconductor epitaxial layer;
   e. forming a first conduction layer over the reflecting layer;
   f. preparing a second substrate;
   g. forming a second conduction layer over the second substrate;
   h. bonding the first conduction layer and the second conduction layer by thermal pressing;
   i. removing the first substrate;
   j. forming a second conductive layer on a second face of the semiconductor epitaxial layer opposite to the first face.

2. The method for manufacturing light-emitting device on non-transparent substrate as in claim 1, wherein the semiconductor epitaxial layer is GaN based material.

3. The method for manufacturing light-emitting device on non-transparent substrate as in claim 1, wherein the first substrate is selected from a group consisting of sapphire, Si, GaAs and GaP.

4. The method for manufacturing light-emitting device on non-transparent substrate as in claim 1, wherein the first conductive layer has an area less than an area of the semiconductor epitaxial layer and has pattern in one of dot and mesh fashion.

5. The method for manufacturing light-emitting device on non-transparent substrate as in claim 1, wherein the reflecting layer is selected from a group consisting of Au, Ag and Al.

6. The method for manufacturing light-emitting device on non-transparent substrate as in claim 1, wherein the first conduction layer has a melting point between 160° C. and 400° C.

7. The method for manufacturing light-emitting device on non-transparent substrate as in claim 1, wherein the first conduction layer is selected from a group consisting of In and AuSn.

8. The method for manufacturing light-emitting device on non-transparent substrate as in claim 1, wherein the second substrate is selected from a group consisting of Si, SiC, graphite, Al and Cu.

9. The method for manufacturing light-emitting device on non-transparent substrate as in claim 1, wherein the second conduction layer is Au.

10. The method for manufacturing light-emitting device on non-transparent substrate as in claim 1, wherein the step (h) is performed at temperature between 160° C. and 400° C.

11. The method for manufacturing light-emitting device on non-transparent substrate as in claim 1, wherein the step (h) is performed by at least one of wet- and dry-chemical etching to expose the semiconductor epitaxial layer.

12. The method for manufacturing light-emitting device on non-transparent substrate as in claim 1, wherein the second conductive layer has an area less than an area of the semiconductor epitaxial layer and larger than a wiring pad.

13. The method for manufacturing light-emitting device on non-transparent substrate as in claim 1, wherein the first conductive layer is selected from a group consisting of Ni/Au, Pt/Au and Pd/Au.

14. The method for manufacturing light-emitting device on non-transparent substrate as in claim 1, wherein the semiconductor epitaxial layer is selected from a group consisting of AlGaAs and AlGaInP.

15. The method for manufacturing light-emitting device on non-transparent substrate as in claim 1, wherein the first substrate is selected from a group consisting of Si, Sic and Ge.

16. A method for manufacturing light-emitting device on non-transparent substrate, comprising following steps:
   a. preparing a first substrate;
   b. forming an epitaxial layer of first conductive type on the first substrate;
   c. forming an active epitaxial layer on the epitaxial layer of first conductive type;
   d. forming an epitaxial layer of second conductive type on the active epitaxial layer;
   e. forming a first conductive layer on the epitaxial layer of second conductive type;
   f. forming a reflecting layer over the first conductive layer, the reflecting layer reflecting a light emitted from the active epitaxial layer;
   g. forming a first conduction layer over the reflecting layer;
   h. preparing a second substrate;
   i. forming a wetting layer on the second substrate;
   j. forming a blocking layer on the wetting layer;
   k. forming a second conduction layer over the blocking layer;
   l. bonding the first conduction layer and the second conduction layer by thermal pressing;
   m. removing the first substrate;
   n. forming a second conductive layer on the epitaxial layer of first conductive type.

17. The method for manufacturing light-emitting device on non-transparent substrate as in claim 16, wherein the semiconductor epitaxial layer is GaN based material.

18. The method for manufacturing light-emitting device on non-transparent substrate as in claim 16, wherein the first substrate is selected from a group consisting of Si, GaAs and GaP.

19. The method for manufacturing light-emitting device on non-transparent substrate as in claim 16, wherein the first conductive type is N type and the second conductive type is P type.

20. The method for manufacturing light-emitting device on non-transparent substrate as in claim 16, wherein the first conductive layer has an area less than an area of the semiconductor epitaxial layer and has pattern in one of dot and mesh fashion.

21. The method for manufacturing light-emitting device on non-transparent substrate as in claim 16, wherein the reflecting layer is selected from a group consisting of Au, Ag and Al.

22. The method for manufacturing light-emitting device on non-transparent substrate as in claim 16, wherein the first conduction layer has a melting point between 160° C. and 400° C.

23. The method for manufacturing light-emitting device on non-transparent substrate as in claim 16, wherein the first conduction layer is selected from a group consisting of In and AuSn.

24. The method for manufacturing light-emitting device on non-transparent substrate as in claim 16, wherein the second substrate is selected from a group consisting of Si, SiC, graphite, Al and Cu.

25. The method for manufacturing light-emitting device on non-transparent substrate as in claim 16, wherein the wetting layer is selected from a group consisting of Ti and Cr.

26. The method for manufacturing light-emitting device on non-transparent substrate as in claim 16, wherein the blocking layer is selected from a group consisting of Pt and Mo.

27. The method for manufacturing light-emitting device on non-transparent substrate as in claim 16, wherein the second conduction layer is Au.

28. The method for manufacturing light-emitting device on non-transparent substrate as in claim 16, wherein the step (l) is performed at temperature between 160° C. and 400° C.

29. The method for manufacturing light-emitting device on non-transparent substrate as in claim 16, wherein the step (m) is performed by at least one of wet- and dry-chemical etching to expose the semiconductor epitaxial layer.

30. The method for manufacturing light-emitting device on non-transparent substrate as in claim 16, wherein the second conductive layer has an area less than an area of the semiconductor epitaxial layer and larger than a wiring pad.

31. The method for manufacturing light-emitting device on non-transparent substrate as in claim 16, wherein the second conductive layer is selected from a group consisting of Ti/Al and Ti/Au.

32. The method for manufacturing light-emitting device on non-transparent substrate as in claim 16, wherein the first conductive layer is selected from a group consisting of Ni/Au, Pt/Au and Pd/Au.

33. The method for manufacturing light-emitting device on non-transparent substrate as in claim 17, wherein the semiconductor epitaxial layer is selected from a group consisting of AlGaAs and AlGaInP.

34. The method for manufacturing light-emitting device on non-transparent substrate as in claim 18, wherein the first substrate is selected from a group consisting of Si and Ge.

35. The method for manufacturing light-emitting device on non-transparent substrate as in claim 31, wherein the second conductive layer is selected from a group consisting of AuGe/Ni/Au and AuGe/Au.

36. The method for manufacturing light-emitting device on non-transparent substrate as in claim 32, wherein the first conductive layer is selected from a group consisting of Ti/Pt//Au, AuBe/Au amd AuZn/Au.

* * * * *